(12) United States Patent
Yamamoto (10) Patent No.: US 10,247,152 B2
(45) Date of Patent: Apr. 2, 2019

(54) MULTI-LAYER PIEZOELECTRIC ELEMENT, AND INJECTION DEVICE AND FUEL INJECTION SYSTEM PROVIDED WITH THE MULTI-LAYER PIEZOELECTRIC ELEMENT

(71) Applicant: KYOCERA Corporation, Kyoto-shi, Kyoto (JP)

(72) Inventor: Ken Yamamoto, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 156 days.

(21) Appl. No.: 15/313,745

(22) PCT Filed: Apr. 21, 2015

(86) PCT No.: PCT/JP2015/062086
§ 371 (c)(1),
(2) Date: Nov. 23, 2016

(87) PCT Pub. No.: WO2016/013265
PCT Pub. Date: Jan. 28, 2016

(65) Prior Publication Data
US 2017/0198669 A1 Jul. 13, 2017

(30) Foreign Application Priority Data
Jul. 22, 2014 (JP) .................. 2014-148897

(51) Int. Cl.
*F02D 41/38* (2006.01)
*F02M 51/06* (2006.01)
(Continued)

(52) U.S. Cl.
CPC ..... *F02M 51/0603* (2013.01); *F02D 41/3809* (2013.01); *F02M 37/04* (2013.01);
(Continued)

(58) Field of Classification Search
CPC .. F02M 51/0603; F02M 55/025; F02M 37/04; F02M 63/0026; F02M 51/005;
(Continued)

(56) References Cited

U.S. PATENT DOCUMENTS

2002/0089266 A1 7/2002 Bindig et al.
2006/0232172 A1* 10/2006 Asano ................. H01L 41/0472
310/366

(Continued)

FOREIGN PATENT DOCUMENTS

EP 2634827 A1 9/2013
JP 2008-211054 A 9/2008
(Continued)

OTHER PUBLICATIONS

JP 2012049426 A—English Translation.*
(Continued)

*Primary Examiner* — Joseph J Dallo
*Assistant Examiner* — Scott A Reinbold
(74) *Attorney, Agent, or Firm* — Volpe and Koenig, P.C.

(57) ABSTRACT

A multi-layer piezoelectric element includes: a stacked body in which piezoelectric layers and internal electrode layers are laminated; a conductor layer disposed on a side face of the stacked body; a conductive joining material layer disposed on a surface of the conductor layer; and an external electrode joined to the conductor layer via the conductive joining material layer, the conductive joining material layer comprising solder and a conductive adhesive, the solder constituting an end of the conductive joining material layer which end confronts an end of the external electrode to be connected to an external circuit. There is provided a multi-layer piezoelectric element which suppresses separation of an end on an input/output side of the external electrode and is driven stably for a long period of time, an injection device
(Continued)

and a fuel injection system which are provided with the multi-layer piezoelectric element.

7 Claims, 9 Drawing Sheets

(51) Int. Cl.
    *F02M 55/02* (2006.01)
    *H01L 41/047* (2006.01)
    *H01L 41/083* (2006.01)
    *H01L 41/293* (2013.01)
    *F02M 37/04* (2006.01)
(52) U.S. Cl.
    CPC ....... *F02M 55/025* (2013.01); *H01L 41/0471* (2013.01); *H01L 41/0472* (2013.01); *H01L 41/083* (2013.01); *H01L 41/293* (2013.01)
(58) Field of Classification Search
    CPC ............. F02M 59/468; F02M 2200/21; F02M 51/00–51/06; H01L 41/293; H01L 41/0471; H01L 41/0472; H01L 41/083–41/0838; F02D 41/3809; Y10T 29/42; B05B 17/0607
    USPC ........................................................ 123/294
    See application file for complete search history.

(56) References Cited

U.S. PATENT DOCUMENTS

| 2008/0001503 A1* | 1/2008 | Asano ................. H01L 41/0472 310/366 |
| 2013/0233278 A1* | 9/2013 | Sato .................... H01L 41/0472 123/456 |
| 2013/0248623 A1* | 9/2013 | Kastl .................. F02M 51/0603 239/585.1 |

FOREIGN PATENT DOCUMENTS

| JP | 2012-049426 A | | 3/2012 |
| JP | 2012049426 A | * | 3/2012 |
| JP | 2012049426 A | * | 3/2012 |
| JP | 2012-114212 A | | 6/2012 |
| WO | 2012/057327 A1 | | 5/2012 |

OTHER PUBLICATIONS

JP 2012049426 A—English Translation (Year: 2012).*
International Search Report, PCT/JP2015/062086, dated Jun. 30, 2015, 2 pgs.
Extended European Search Report, European Application No. 15824922.7, dated Mar. 6, 2018, 7 pgs.

* cited by examiner

MULTI-LAYER PIEZOELECTRIC ELEMENT, AND INJECTION DEVICE AND FUEL INJECTION SYSTEM PROVIDED WITH THE MULTI-LAYER PIEZOELECTRIC ELEMENT

TECHNICAL FIELD

The present invention relates to a multi-layer piezoelectric element which is used as, for example, a piezoelectric driving element (piezoelectric actuator), a pressure sensor element, and a piezoelectric circuit element, and an injection device and a fuel injection system which are provided with the multi-layer piezoelectric element.

BACKGROUND ART

Figure 9A:
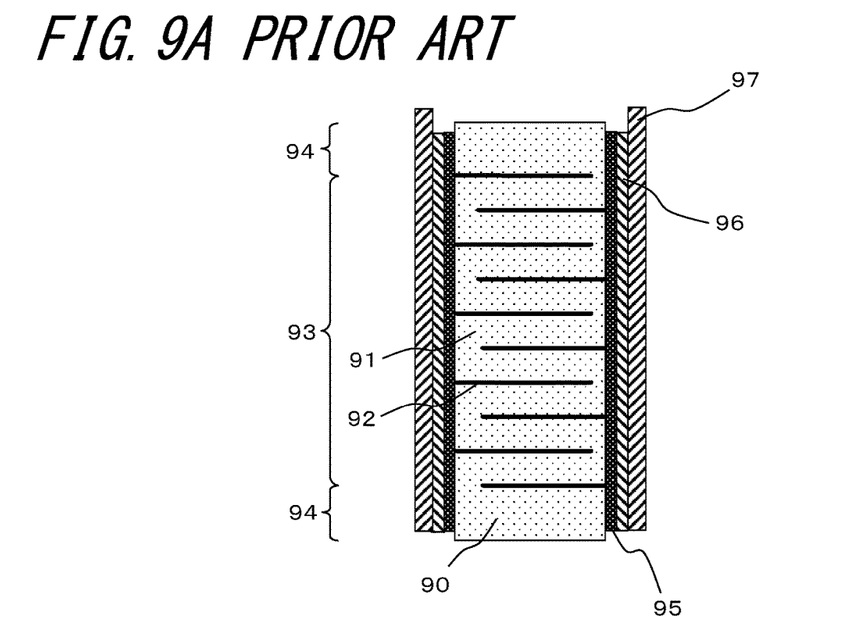
FIG. 9A is a schematic longitudinal sectional view showing one embodiment of a conventional multi-layer piezoelectric element.
Figure 9B:
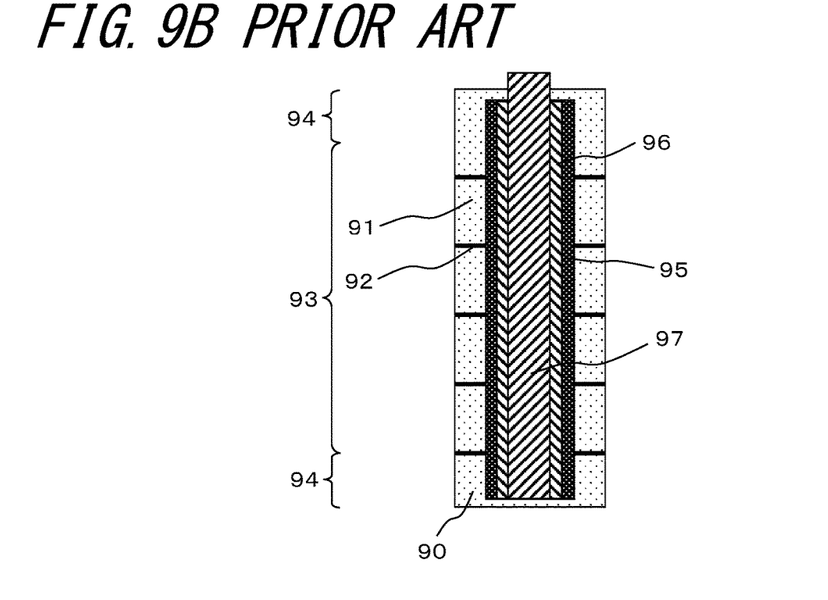
FIG. 9B is a right-hand side view of the multi-layer piezoelectric element shown in FIG. 9A.

As shown in FIGS. 9A and 9B, there is a heretofore known multi-layer piezoelectric element comprising: a stacked body 90 comprising an active section 93 in which piezoelectric layers 91 and internal electrode layers 92 are laminated, and an inactive section 94 which is disposed at each end of the active section 93 in a stacking direction and includes the piezoelectric layer 91 but is free of the internal electrode layer 92; a conductor layer 95 which is disposed on a side face of the stacked body 90 so as to extend from the active section 93 to the inactive section 94; a conductive joining material layer 96 made of a conductive adhesive; and an external electrode 97 which is attached to the side face of the stacked body 90 through the conductive joining material layer 96 (refer to Patent Literature 1).

CITATION LIST

Patent Literature

Patent Literature 1: Japanese Unexamined Patent Publication JP-A 2008-211054

SUMMARY OF INVENTION

Technical Problem

In the multi-layer piezoelectric element described in Patent Literature 1, during its driving, a crack may be developed at the internal electrode layer 92 lying between the inactive section 94 and the active section 93, and, if the crack runs through the conductor layer 95 with consequent crack propagation in the conductive joining material layer 96 made of the conductive adhesive, an end of the external electrode 97 to be connected to an external circuit may be separated. In this case, the possibility arises that due to sparking the stability of the driving will be impaired.

The invention has been devised in view of the problems as discussed supra, and accordingly an object of the invention is to provide a multi-layer piezoelectric element which is driven stably for a long period of time, and also an injection device and a fuel injection system which are provided with the multi-layer piezoelectric element.

Solution to Problem

The invention provides a multi-layer piezoelectric element comprising: a stacked body in which piezoelectric layers and internal electrode layers are laminated; a conductor layer disposed on a side face of the stacked body; a conductive joining material layer disposed on a surface of the conductor layer; and an external electrode joined to the conductor layer via the conductive joining material layer, the conductive joining material layer comprising solder and a conductive adhesive, the solder constituting an end of the conductive joining material layer which end confronts an end of the external electrode to be connected to an external circuit.

Moreover, the invention provides an injection device comprising a container provided with an injection hole and the above-described multi-layer piezoelectric element, a fluid stored in the container being injected through the injection hole by driving the multi-layer piezoelectric element.

Moreover, the invention provides a fuel injection system comprising: a common rail configured to store a high-pressure fuel; the above-described injection device configured to inject the high-pressure fuel stored in the common rail; a pressure pump configured to supply the high-pressure fuel to the common rail; and an injection control unit configured to send a driving signal to the injection device.

Advantageous Effects of Invention

The multi-layer piezoelectric element pursuant to the invention can be driven stably for a long period of time.

Moreover, the injection device and the fuel injection system provided with the above-described multi-layer piezoelectric element can be driven stably for a long period of time by virtue of excellent long-term reliability of the multi-layer piezoelectric element.

DESCRIPTION OF EMBODIMENTS

Hereinafter, a multi-layer piezoelectric element in accordance with one embodiment of the invention will be described with reference to drawings.

Figure 1A:
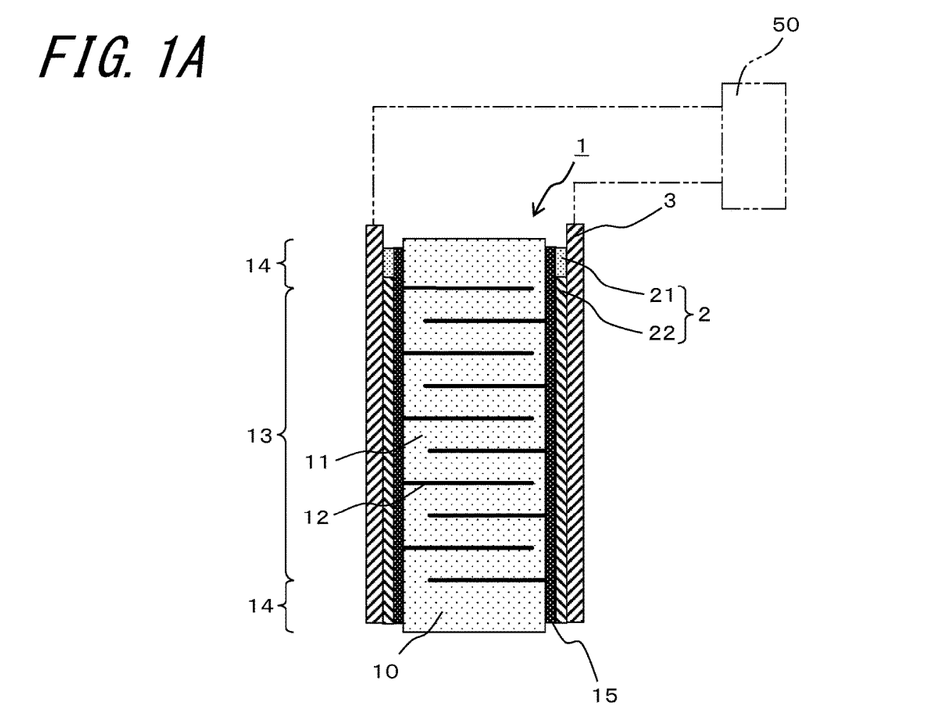
FIG. 1A is a schematic longitudinal sectional view showing the multi-layer piezoelectric element in accordance with one embodiment of the invention.
Figure 1B:
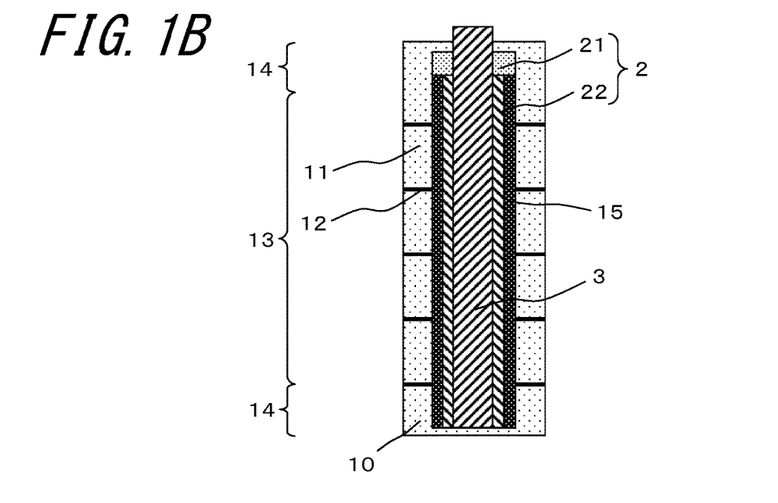
FIG. 1B is a right-hand side view of the multi-layer piezoelectric element shown in FIG. 1A.

FIG. 1A is a schematic longitudinal sectional view showing the multi-layer piezoelectric element in accordance with one embodiment of the invention, and FIG. 1B is a right-hand side view of the multi-layer piezoelectric element shown in FIG. 1A.

The multi-layer piezoelectric element 1 shown in FIGS. 1A and 1B comprises: a stacked body 10 in which piezoelectric layers 11 and internal electrode layers 12 are laminated; a conductor layer 15 disposed on a side face of the stacked body 10; a conductive joining material layer 2 disposed on a surface of the conductor layer 15; and an external electrode 3 joined to the conductor layer 15 via a conductive joining material layer 2. The conductive joining material layer 2 comprises solder 21 and a conductive adhesive 22, and, the solder 21 constitutes an end of the conductive joining material layer 2 which end confronts an end of the external electrode 3 to be connected to an external circuit 50, and the conductive adhesive 22 constitutes other part of the conductive joining material layer 2 than the end of the conductive joining material layer 2.

The stacked body 10 constituting the multi-layer piezoelectric element 1 comprises an active section 13 the piezoelectric layers 11 and the internal electrode layers 12 are laminated, and an inactive section 14 composed of the piezoelectric layer 11 disposed at each end of the stacked body in a stacking direction so as to be located outside of the active section 13. The stacked body 10 has a rectangular parallelepiped form which is, for example, 1.5 to 10 mm in length, 1.5 to 10 mm in width, and 1.5 to 100 mm in height.

The piezoelectric layer 11 constituting the stacked body 10 is made of ceramics having piezoelectric properties. As such a ceramics material, for example, it is possible to use a perovskite oxide made of lead zirconate titanate ($PbZrO_3$—$PbTiO_3$), lithium niobate ($LiNbO_3$), and lithium tantalate ($LiTaO_3$). The piezoelectric layer 11 has a thickness of 3 to 250 μm, for example.

The internal electrode layers 12 constituting the stacked body 10 are formed through co-firing with the ceramics for forming the piezoelectric layer 11. In the active section 13, the internal electrode layers 12 and the piezoelectric layers 11 are alternately stacked so that positive electrodes and negative electrodes are alternately arranged according to the stacking order, thus permitting application of a driving voltage to the piezoelectric layer 11 sandwiched between the internal electrode layers 12. As the material for forming the internal electrode layer 12, for example, it is possible to use a conductor composed predominantly of a silver-palladium alloy which lends itself to low-temperature firing, or a conductor containing copper, platinum, and so forth. In the embodiment shown in FIGS. 1A and 1B, the positive electrodes and the negative electrodes (or grounding electrodes) are alternately led out to corresponding paired opposite side faces of the stacked body 10 so as to make electrical connection with corresponding paired conductor layers 15. The internal electrode layer 12 has a thickness of 0.1 to 5 μm, for example.

Moreover, the side face of the stacked body 10 is formed with the conductor layer 15. In the embodiment shown in FIGS. 1A and 1B, the conductor layer 15 is disposed on each of the paired opposite side faces of the stacked body 10 so as to extend from the active section 13 to the inactive section 14 while making electrical connection with the internal electrode layer 12. For example, the conductor layer 15 is obtained by baking a silver paste. To strengthen the joining of the conductor layer 15 to the stacked body 10, powder of the material constituting the stacked body 10 may be added to the silver paste as a filler. The conductor layer 15 has a thickness of 10 to 50 μm, for example, and has a width of 0.6 to 8.0 mm, for example.

The surface of the conductor layer 15 disposed on the side face of the stacked body 10 is provided with the conductive joining material layer 2, and is also joined with the external electrode 3 via the conductive joining material layer 2.

The conductive joining material layer 2 provides electrical connection between the conductor layer 15 disposed on the side face of the stacked body 10 and the external electrode 3. In the embodiment shown in FIGS. 1A and 1B, the conductive joining material layer 2 is disposed so as to extend from the active section 13 to the inactive section 14. The specific structure of the conductive joining material layer 2 will be described later.

The external electrode 3 is located on each of the paired opposite side faces of the stacked body 10, is electrically connected to the conductor layer 15 via the conductive joining material layer 2, and is electrically connected to the internal electrode layer 12. For example, the pair of external electrodes 3 is composed of a plate of metal such for example as copper, iron, stainless steel, or phosphor bronze. The external electrode 3 has a width of 0.5 to 6 mm, for example. Moreover, the external electrode 3 is greater in thickness than the conductor layer 15 and the conductive joining material layer 2, and thus has a thickness of 0.1 to 0.3 mm, for example. The external electrode 3 is not limited to the metal plate of plate-like configuration, but may be of a metal plate provided with a slit in its width direction, a metal plate of meshed configuration, or a metal plate having a corrugated sectional profile, for obtaining the effect of relaxing the stress resulting from expansion and contraction of the stacked body 10.

The conductive joining material layer 2 comprises the solder 21 and the conductive adhesive 22. The solder 21 constitutes the end of the conductive joining material layer 2 which end confronts an end of the external electrode 3 to be connected to an external circuit 50. As the solder 21, it is possible to use Pb-free solder represented by Sn—Ag—Cu solder for example.

Moreover, the conductive adhesive 22 constituting the conductive joining material layer 2 is provided in other part of the conductive joining material layer 2 than the end of the conductive joining material layer 2 which end confronts the end of the external electrode 3 to be connected to an external circuit 50. As the conductive adhesive 22, it is possible to use an epoxy resin-made or polyimide resin-made adhesive containing conductive particles (for example, high conductive metal particles such as Ag particles or Cu particles). The conductive joining material layer 2, having the conductive adhesive 22 at its part other than the end which confronts the end of the external electrode 3 to be connected to an external circuit 50, expands and contracts in response to expansion and contraction of the stacked body 10 during its driving, thus causing no obstruction to the expansion and contraction.

As will hereafter be described, a lead 4 is joined to one of the ends of the external electrode 3 for connection with an external circuit 50. Input/output power is fed to the external electrode 3 via the lead 4. That is, the end of the external electrode 3 to be connected to an external circuit 50 refers to the one end of the external electrode 3 to which the lead 4 is joined. Moreover, the end of the conductive joining material layer 2 which end confronts the end of the external electrode 3 to be connected to an external circuit 50 refers to, of the opposite ends in a longitudinal direction of the conductive joining material layer 2, the one located on a side of the external electrode 3 to be connected to an external circuit 50.

During driving of the multi-layer piezoelectric element 1, due to stress concentration on the boundary between the active section 13 and the inactive section 14, the internal electrode layer 12 located in this area is prone to cracking. In the event that a resulting crack runs through the conductor layer 15, if the conductive adhesive 22 extends to the end of the conductive joining material layer 2, propagation of the crack tends to occur also in the end of the conductive joining material layer 2 along the boundary between a conductive particle and resin constituting the conductive adhesive 22.

By way of contrast, since the conductive joining material layer 2 comprises the solder 21 and the conductive adhesive 22, and the solder 21 constitutes the end of the conductive joining material layer 2 which end confronts the end of the external electrode 3 to be connected to an external circuit 50, even if a crack developed in the internal electrode layer 12 located at the boundary between the active section 13 and the inactive section 14 during driving runs through the conductor layer 15 with consequent propagation of the crack in the conductive adhesive 22, upon reaching the solder 21, the crack is restrained against further propagation. This makes it possible to prevent the end of the external electrode 3 to be connected to an external circuit 50 from being separated, and thereby suppress occurrence of sparking, thus enabling stable driving for a long period of time.

The conductive joining material layer 2 has a thickness of 2 to 30 µm, for example, and has a width which is equal to 40 to 110% of the width of the external electrode 3, and more specifically a width of 0.4 to 7 mm, for example.

Moreover, the solder 21 has a length (length along the stacking direction of the stacked body 10) of 0.5 to 2.5 mm, for example. While the solder 21 may be provided so as to lie within the range of the inactive section 14, as will hereafter be described, the solder 21 may extend to the boundary between the active section 13 and the inactive section 14, or extend further to the active section 13. Moreover, as shown in the drawing, the solder 21 may be wettably spread widthwise over the region formed with the conductor layer 15.

Figure 2:
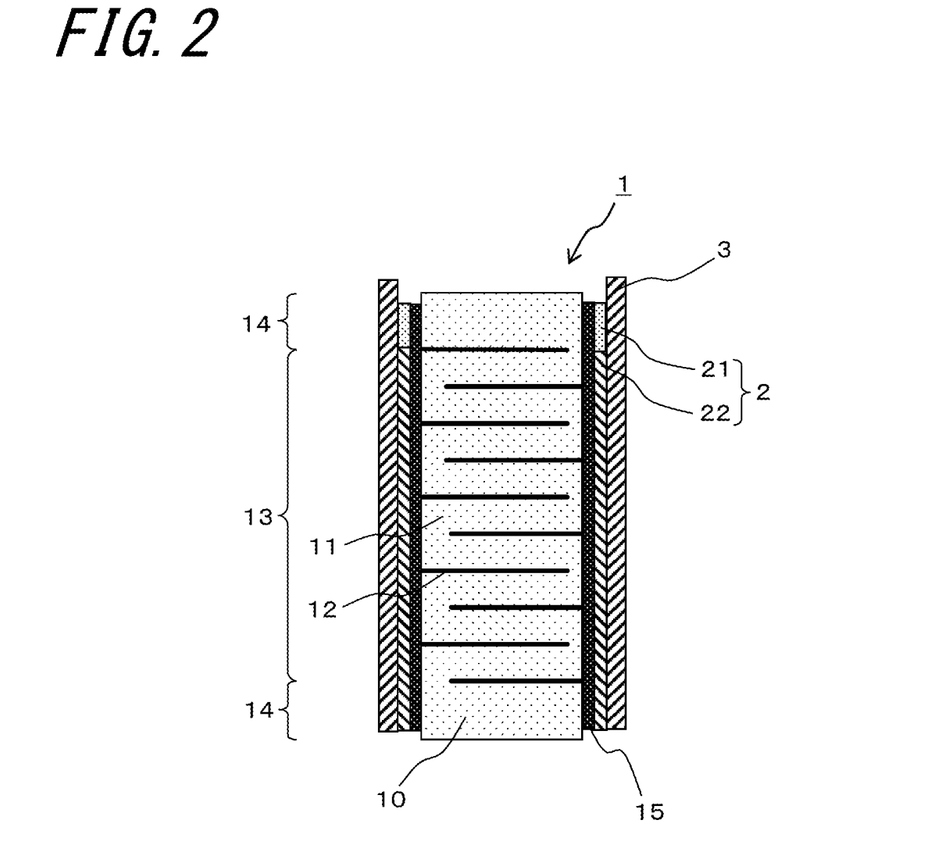
FIG. 2 is a schematic longitudinal sectional view showing the multi-layer piezoelectric element in accordance with another embodiment of the invention.

As shown in FIG. 2, the boundary between the solder 21 and the conductive adhesive 22 constituting the conductive joining material layer 2 may be located at a position corresponding to the boundary between the active section 13 and the inactive section 14. As described above, during driving of the multi-layer piezoelectric element 1, due to stress concentration on the boundary between the active section 13 and the inactive section 14, the internal electrode layer 12 located in this area is prone to cracking. In this regard, when the boundary between the solder 21 and the conductive adhesive 22 constituting the conductive joining material layer 2 is located at a position corresponding to the boundary between the active section 13 and the inactive section 14, this helps facilitate occurrence of parting at the boundary region, and the parting is conducive to stress relaxation during driving. The stress relaxation helps inhibit crack propagation, thus achieving improvement in reliability.

The arrangement in which the boundary between the solder 21 and the conductive adhesive 22 constituting the conductive joining material layer 2 is located at a position corresponding to the boundary between the active section 13 and the inactive section 14 means that, looking the section of the multi-layer piezoelectric element 1 taken along the stacking direction so as to include the boundary between the active section 13 and the inactive section 14 of the stacked body 10 and the conductive joining material layer 2, the internal electrode layer 12 located at the boundary between the active section 13 and the inactive section 14 and at least part of the boundary between the solder 21 and the conductive adhesive 22 overlap each other. In other words, it means that the boundary between the solder 21 and the conductive adhesive 22 is, at least partly, located on a continuation of the internal electrode layer 12 located at the boundary between the active section 13 and the inactive section 14.

The above arrangement holds true not only for a case where the boundary between the solder 21 and the conductive adhesive is parallel to the internal electrode layer 12 and is perpendicular to the stacking direction, but also for a case where the boundary is inclined or curved as seen in the above-described section.

Figure 3:
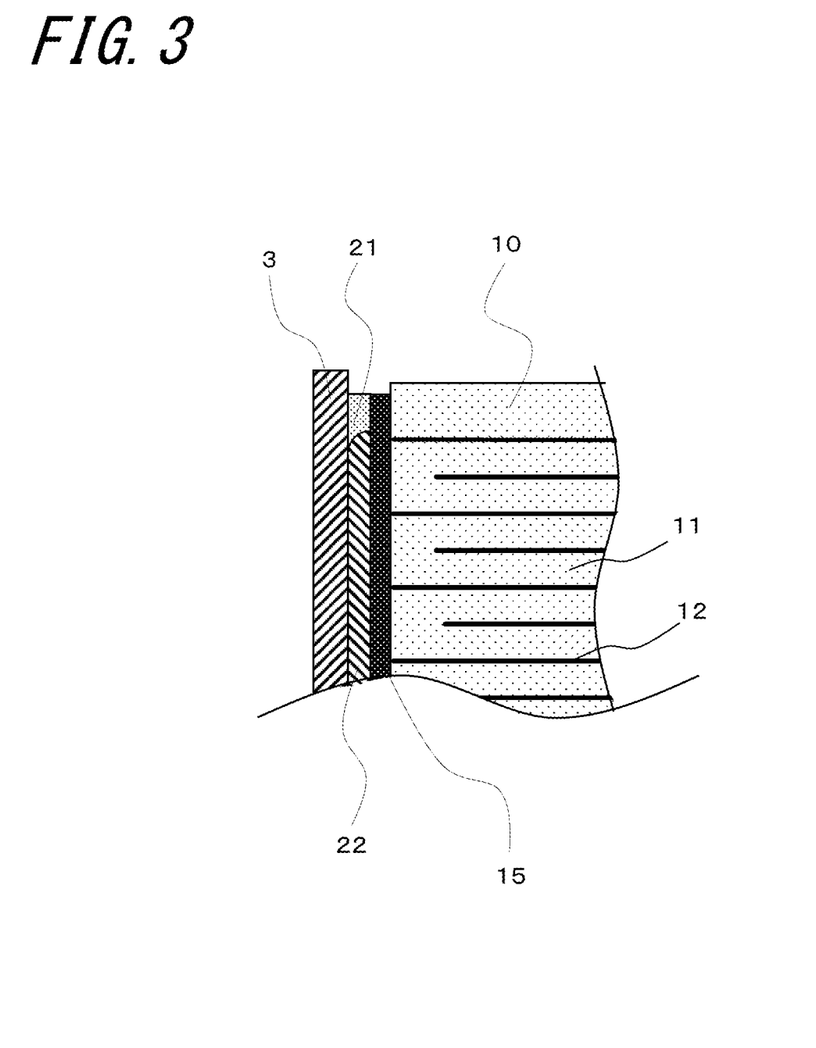
FIG. 3 is an enlarged sectional view showing a principal part of the multi-layer piezoelectric element in accordance with another embodiment of the invention.

Moreover, as shown in FIG. 3, when the boundary between the solder 21 and the conductive adhesive 22 is viewed in a section taken along the stacking direction (the section perpendicular to the external electrode 1) thereof, given that a side facing the conductor layer 15 is a lower side, the conductive adhesive 22 extends, at a side facing the conductor layer 15 thereof, from the active section 13 to the inactive section 14 so as to run beneath the solder 21, thus imparting an inclination or curve to the boundary. With this configuration, since the area of the conductive adhesive 22 is increased on the conductor layer 15-facing side, it is possible to restrain the crack against further propagation when it reaches the solder 21 while allowing the stacked body 10 to expand and contract more freely without obstruction, and thereby render the end of the external electrode 3 to be connected to an external circuit 50 less prone to being separated.

At this time, it is preferable that the boundary between the solder 21 and the conductive adhesive 22 lies within the range extending from the internal electrode layer 12 located at the boundary between the active section 13 and the inactive section 14 to each of points spaced away from the internal electrode layer 12 on the active section 13 side and the inactive section 14 side, respectively, by a distance equal to the total thickness of three piezoelectric layers 11.

Instead of the arrangement in which both the solder 21 and the conductive adhesive 22 are located at a position corresponding to the boundary between the active section 13 and the inactive section 14, an arrangement in which only the solder 21 is located at a position corresponding to the boundary may be adopted. In other words, the stacked body 10 comprises the active section 13 and the inactive section 14, and, the boundary between the solder 21 and the conductive adhesive 22 constituting the conductive joining material layer 2 is located on the active section 13 side beyond the boundary between the active section 13 and the inactive section 14. In this case, even if the crack developed in the internal electrode layer 12 located at the boundary between the active section 13 and the inactive section 14 during driving runs through the conductor layer 15, upon reaching the solder 21, the crack is restrained against further propagation.

Figure 4A:
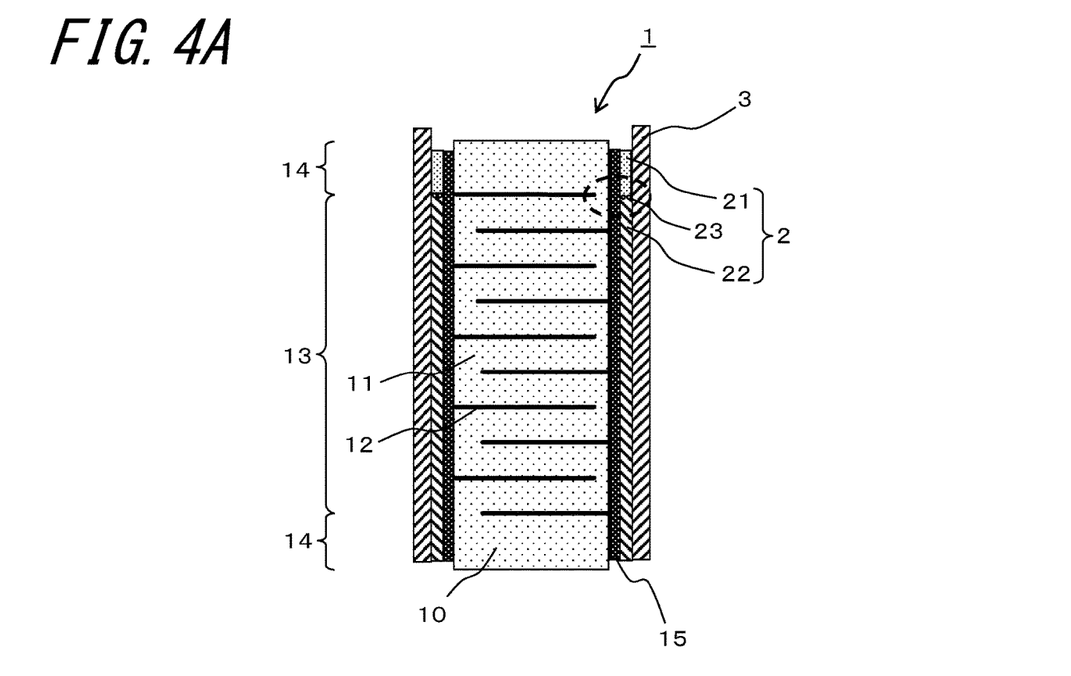
FIG. 4A is a schematic longitudinal sectional view showing the multi-layer piezoelectric element in accordance with another embodiment of the invention.
Figure 4B:
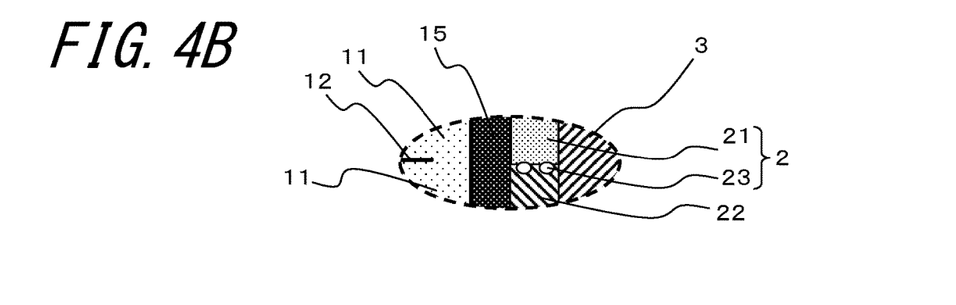
FIG. 4B is an enlarged view of a principal part thereof encircled by a broken line in FIG. 4A.

Moreover, as shown in FIGS. 4A and 4B, it is desirable to provide a void 23 in the boundary between the solder 21 and the conductive adhesive 22 constituting the conductive joining material layer 2. In the presence of the void 23, parting occurs more smoothly at the boundary between the solder 21 and the conductive adhesive 22, thus achieving further stress relaxation during driving for inhibition of further crack propagation. Consequently, the end of the external electrode 3 to be connected to an external circuit 50 becomes more resistant to separation, wherefore higher degree of reliability can be attained. Note that the presence of the void 23 in the boundary between the solder 21 and the conductive adhesive 22 is construed as encompassing the presence of the void 23 in a part of the conductive adhesive 22 which faces the boundary between the conductive adhesive 22 and the solder 21. In the conductive joining material layer 2 as seen in transverse section, the void 23 has a diameter of 0.3 to 15 µm, for example, and, based on the thickness of the conductive joining material layer 2 (the conductive adhesive 22) sectioned along the boundary, the length dimension of the void 23 constitutes 20% to 70%, for example.

Figure 5A:
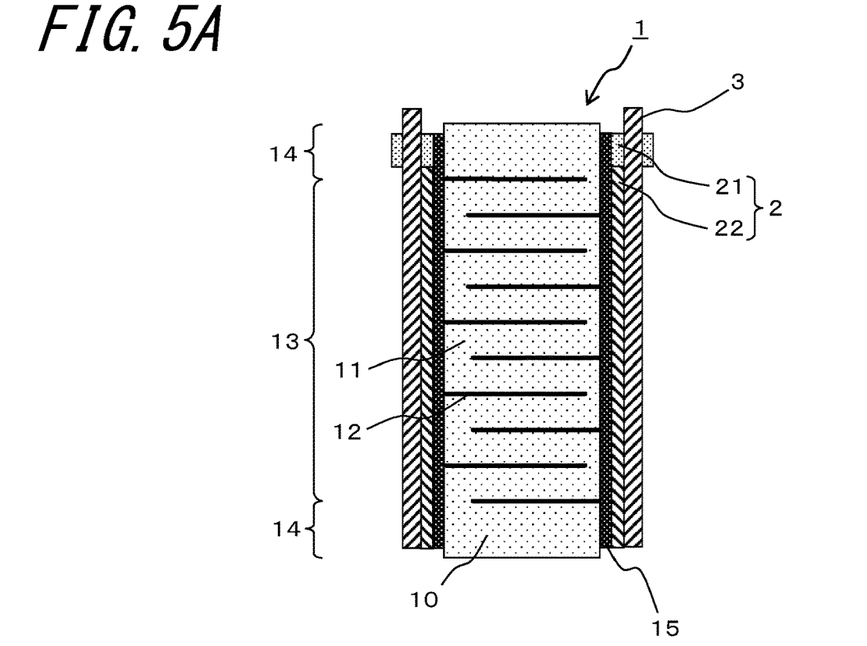
FIG. 5A is a schematic longitudinal sectional view showing the multi-layer piezoelectric element in accordance with one embodiment of the invention.
Figure 5B:
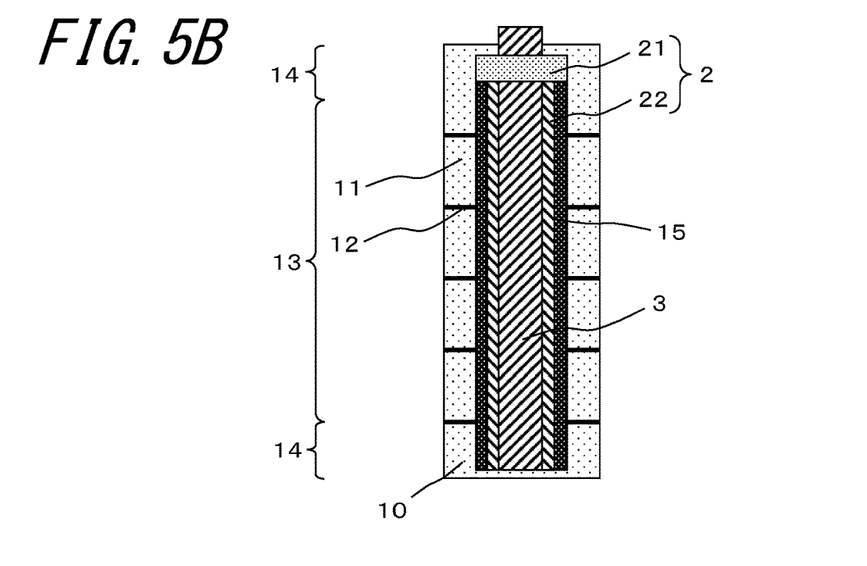
FIG. 5B is a right-hand side view of the multi-layer piezoelectric element shown in FIG. 5A.

Moreover, as shown in FIGS. 5A and 5B, in addition to lying between the side face of the stacked body 10 and the external electrode 3 (lying interiorly of the external electrode 3), the solder 21 may be applied so as to pass exteriorly of the external electrode 3. In the external electrode 3 joined at an outer side thereof to the solder 21, it is possible to further suppress separation of an end of the external electrode 3 to be connected to an external circuit 50. Also in this case, as shown in the drawing, the solder 21 may be wettably spread over the region formed with the conductor layer 15.

Figure 6A:
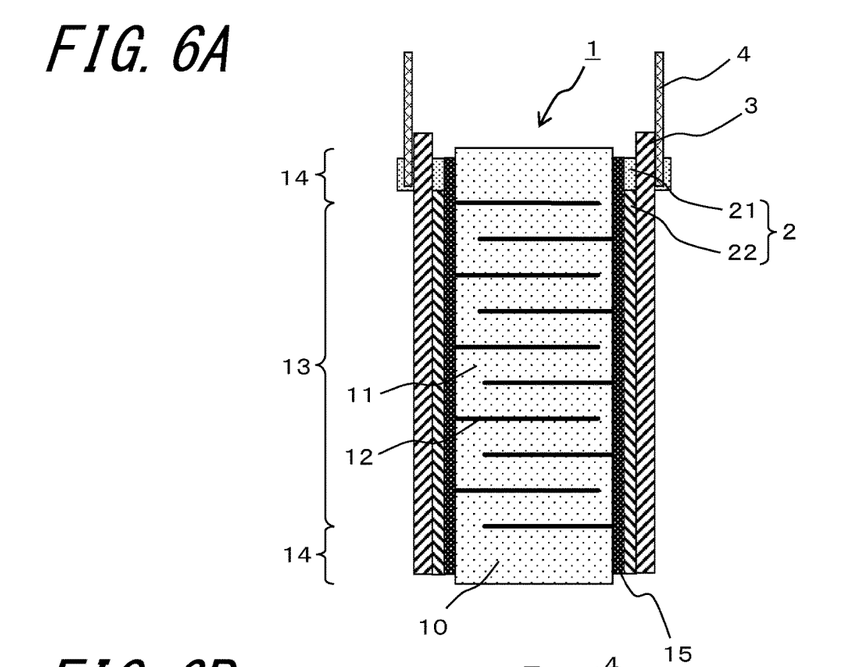
FIG. 6A is a schematic longitudinal sectional view showing the multi-layer piezoelectric element in accordance with one embodiment of the invention.
Figure 6B:
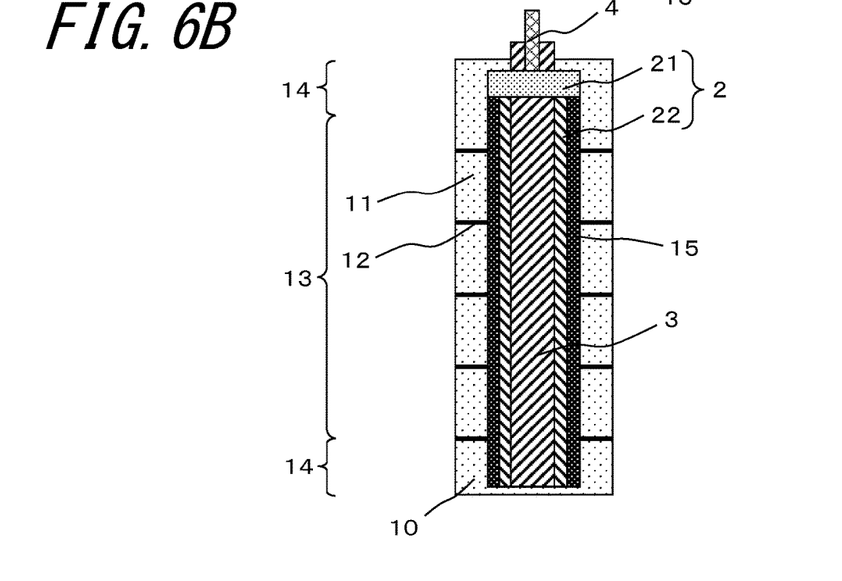
FIG. 6B is a right-hand side view of the multi-layer piezoelectric element shown in FIG. 6A.

Moreover, as shown in FIGS. 6A and 6B, it is preferable that the lead 4 is joined, via the solder 21, to the end of the external electrode 3 to be connected to an external circuit 50. In this case, the placement of the solder 21 at the end of the conductive joining material layer 2 and the connection of the lead 4 to the external electrode 3 can be effected at one time, thus conducing simplification of manufacturing process and cost reduction. Moreover, while heat is generated in the solder 21 under the passage of electric current, since the metallic compound-made solder 21 is greater in thermal expansion than the resin-containing conductive adhesive 22, it follows that the conductive adhesive 22 and the solder 21 are susceptible to parting. The parting helps relax the stress on the boundary between the active section 13 and the inactive section 14, wherefore the end of the external electrode 3 to be connected to an external circuit 50 becomes more resistant to separation, thus attaining higher degree of reliability.

Moreover, although not shown in the drawing, it is preferable that a reaction layer which undergoes reaction with the solder 21 is provided at the end of the conductor layer 15 which end confronts the end of the conductive joining material layer 2 constituted by the solder 21. When the reaction layer which undergoes reaction with the solder 21 is provided at the end of the conductor layer 15, that is; when the metallic components of, respectively, the solder 21 and the conductor layer 15 are melted and adhere together tightly, the end of the external electrode 3 to be connected to an external circuit 50 becomes more resistant to separation. Especially when applying the solder 21 so as to pass exteriorly of the external electrode 3, it is possible to further suppress separation of the end of the external electrode 3 to be connected to an external circuit 50.

For example, the presence of the reaction layer can be checked by mapping process using electron probe microanalyzer (EPMA).

Moreover, although the above embodiment has been described with respect to the case where the solder 21 and the conductive adhesive 22 constituting the conductive joining material layer 2 are in contact or partly contact with each other, a clearance may be left at the boundary between the solder 21 and the conductive adhesive 22 constituting the conductive joining material layer 2, so that the solder 21 and the conductive adhesive 22 are spaced apart (not shown in the drawing). Also in this case, the solder constitutes the end of the conductive joining material layer 2 which end confronts the end of the external electrode 3 to be connected to an external circuit 50, and, in addition, the boundary between the solder 21 and the conductive adhesive 22 constituting the conductive joining material layer 2 is located at a position corresponding to the boundary between the active section 13 and the inactive section 14, or the boundary between the solder 21 and the conductive adhesive 22 constituting the conductive joining material layer 2 is located at a position corresponding to the active section 13.

The following describes a method for manufacturing the multi-layer piezoelectric element 1 according to this embodiment.

First, ceramic green sheets used for the piezoelectric layers 11 are formed. More specifically, calcined powder of piezoelectric ceramics, a binder made of an organic high polymer such as acrylic polymer or butyral polymer, and a plasticizer are mixed together to prepare a ceramic slurry. Then, ceramic green sheets are formed of the ceramic slurry by a tape molding method such as doctor blade technique or calender roll technique. As the piezoelectric ceramics, it is possible to use a material having piezoelectric properties such for example as a perovskite oxide made of lead zirconate titanate ($PbZrO_3$—$PbTiO_3$). Moreover, as the plasticizer, it is possible to use dibutyl phthalate (DBP) or dioctyl phthalate (DOP), for example.

Next, a conductive paste for forming the internal electrode layers 12 is prepared. More specifically, the conductive paste is prepared by admixing a binder and a plasticizer in metallic powder of a silver-palladium alloy. This conductive paste is applied, in an internal-electrode-layer 12 pattern, onto the above-described ceramic green sheet by screen printing technique. Then, a plurality of ceramic green sheets with the printed conductive paste are stacked on top of each other, and, the stack is subjected to debinding, or binder removal treatment at a predetermined temperature, is fired at a temperature of 900 to 1200° C., and is ground into a predetermined shape by a surface grinder or other means. In this way, there is produced the active section 13 in which piezoelectric layers 11 and internal electrode layers 12 are alternately laminated. The inactive section 14 is produced by stacking together ceramic green sheets free of the conductive paste for forming the internal electrode layers 12. The active section 13 and the inactive section 14 are combined into the stacked body 10.

The way of producing the stacked body 10 is not limited to the manufacturing method thus far described, and the stacked body 10 may therefore be produced by any given manufacturing method that enables production of the stacked body 10 composed of a stack of a plurality of piezoelectric layers 11 and internal electrode layers 12.

Next, the conductor layer 15 is provided on the side face of the stacked body 10. For example, the conductor layer 15 is obtained by application of a paste made of Ag powder blended with glass and lead zirconate titanate in powder form using the screen printing technique. The paste applied to the stacked body 10 is baked out at a temperature of 550 to 650° C.

Next, the external electrode 3 is fixedly joined to the conductor layer 15 attached to the side face of the stacked body 10 via the conductive joining material layer 2.

The conductive adhesive 22 constituting the conductive joining material layer 2, which is of an epoxy resin-made or polyimide resin-made adhesive containing high conductive metal powder such as Ag powder or Cu powder, is formed in thicknesses of 5 to 70 μm. The thickness and width of the conductive adhesive 22 can be adjusted to predetermined values when adopting the screen printing technique or dispensing technique for the formation.

To impart an inclination or curve to the boundary between the conductive adhesive 22 and the solder 21 constituting the conductive joining material layer 2 as seen in the section taken along the stacking direction so as to include the boundary between the active section 13 and the inactive section 14 of the stacked body 10 and the conductive joining material layer 2, after shaping the end of the conductive adhesive 22 to have a desired form, the solder 21 is applied so as to fill the remaining clearance.

Moreover, as methods to provide the void 23 in the boundary between the conductive adhesive 22 and the solder 21 constituting the conductive joining material layer 2 (in a part of the conductive adhesive 22 which faces the boundary between the conductive adhesive 22 and the solder 21), the following ways will be considered. For example, when the conductive adhesive 22 is formed by the screen printing technique, printing is effected with use of a screen printing plate having predetermined hole patterns located at a position corresponding to the vicinity of the boundary between the conductive adhesive and the solder 21. Moreover, when adopting the dispensing technique, to provide the void 23 in the boundary between the conductive adhesive 22 and the solder 21 constituting the conductive joining material layer 2, dispensing is performed only on the region where it is desired that adhesive application be effected, with the void-forming region left unapplied, using an instrument having a needle diameter suited to desired application width. In addition, the conductive adhesive in use may be stirred in advance to create air bubbles therein. In this case, by performing dispensing while adjusting the time for vacuum degassing to control air bubbles remaining within the adhesive properly, it is possible to apply the conductive adhesive in a bubble-bearing condition.

It is preferable that the solder 21 constituting the conductive joining material layer 2 is made of tin, silver, and copper. One way to obtain the solder 21 is by soldering typical solder, such as solder in wire form, solder in ribbon form, or a solder paste, at a temperature of 200 to 230° C. using a soldering iron. At this time, the solder is placed on the side face of the external electrode 3, and then, under application of heat, the solder 21 is wettably spread so as to find its way into the gap between the conductor layer 15 and the external electrode 3, thus forming the solder 21 so as to lie at the end of the conductive joining material layer 2. By performing soldering also on the outer side of the external electrode 3, the solder can be formed so as to pass exteriorly of the external electrode 3. Moreover, as will hereafter be described, the connection of the lead 4 becomes possible.

The external electrode 3 is constructed of a flat plate made of metal such as copper, iron, stainless steel, or phosphor bronze, which has a width of 0.5 to 10 mm and a thickness of 0.1 to 0.3 mm, for example. To design the external electrode 3 to have a widthwise slit or to have a meshed configuration, it is advisable to adopt punching technique using a punching die or lasering technique.

The lead 4 is intended to establish electrical conduction between the construction and the exterior thereof. It is preferable that, for example, a copper wire is used for the lead 4, and the lead 4 is plated with silver for the sake of soldering. In the case of covering other part of the lead 4 than a part thereof joined to the external electrode 3, a typical cover material such as PTFE may be used for the covering.

After that, a DC electric field of 0.1 to 3 kV/mm is applied to the external electrode 3 for polarization of the piezoelectric layers 11 constituting the stacked body 10. In this way, the multi-layer piezoelectric element 1 is completed. In the multi-layer piezoelectric element 1 in a condition of making connection with an external power supply via the external electrode 3 and the lead 4, when a voltage is applied to the piezoelectric layers 11, each of the piezoelectric layers 11 undergoes great displacement under inverse piezoelectric effect. Thus, for example, the multi-layer piezoelectric element can be operated as an automotive fuel injection valve for supplying a jet of fuel into an engine.

Figure 7:
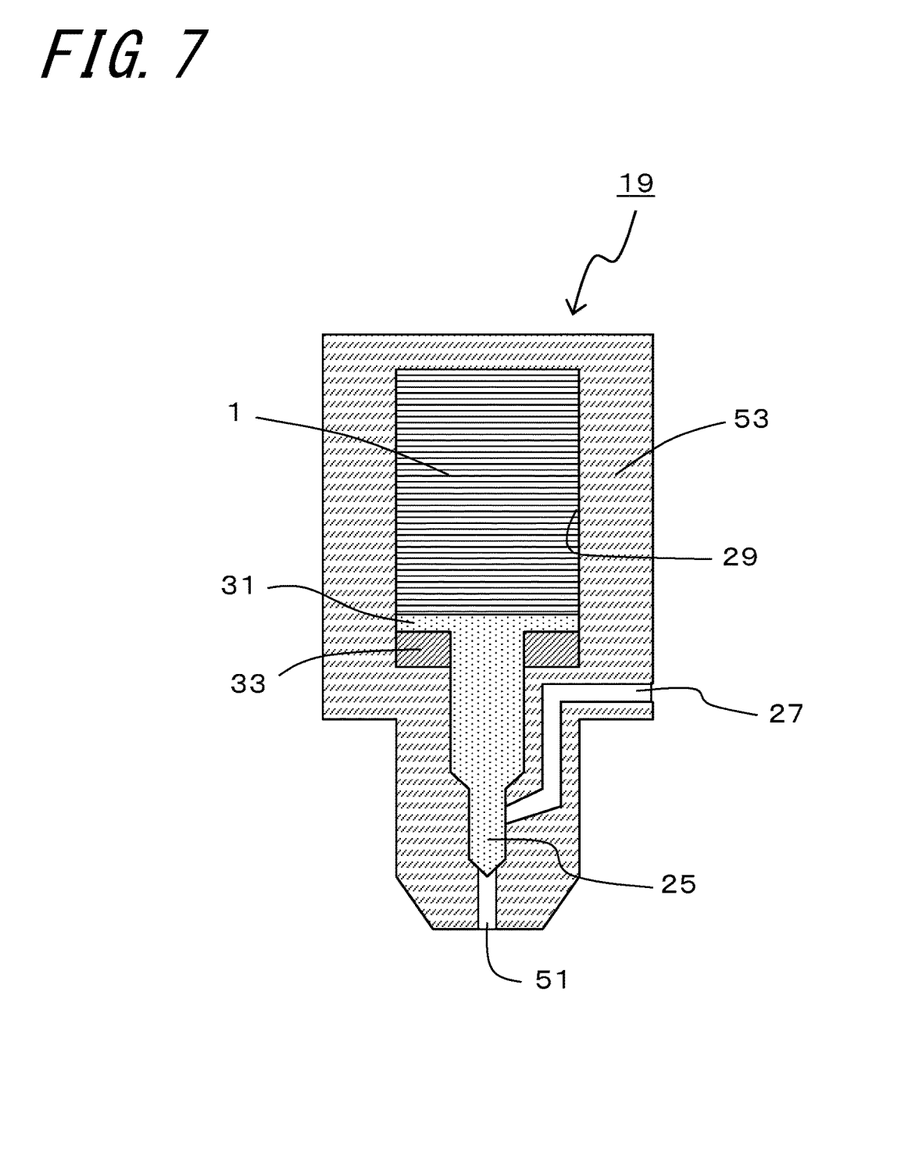
FIG. 7 is a schematic sectional view showing an injection device in accordance with one embodiment of the invention.

The following describes an embodiment of an injection device pursuant to the invention. FIG. 7 is a schematic sectional view showing an injection device in accordance with one embodiment of the invention.

As shown in FIG. 7, the injection device 19 in this embodiment is constructed by placing the exemplified multi-layer piezoelectric element 1 inside a housing (container) 53 provided with an injection hole 51 at one end.

A needle valve 25 capable of opening and closing of the injection hole 51 is disposed inside the housing 53. A fluid channel 27 is disposed for communication with the injection hole in response to the movement of the needle valve 25. The fluid channel 27 is coupled to an external fluid supply source, so that a fluid is constantly fed to the fluid channel 27 under high pressure. Therefore, when the needle valve 25 is operated so as to open the injection hole 51, then the fluid present in the fluid channel 27 is injected, through the injection hole 51, to the outside or into an adjacent container, for example, a fuel chamber of an internal-combustion engine (not shown in the drawing).

The needle valve 25 has an upper end thereof having a large inner diameter to define a piston 31 which is slidably mounted in a cylinder 29 formed in the housing 53. The exemplified multi-layer piezoelectric element 1 is accommodated in contact with the piston 31 inside the housing 53.

In such an injection device 19, as the multi-layer piezoelectric element 1 undergoes expansion under application of a voltage, the piston 31 is pressed correspondingly, thereupon the needle valve 25 acts to block the fluid channel 27 communicating with the injection hole 51 to stop fluid supply. Moreover, upon the interruption of voltage application, the multi-layer piezoelectric element 1 undergoes contraction, and a Belleville spring 33 pushes the piston 31 back, thus opening the fluid channel 27 for communication with the injection hole 51 to permit fluid injection from the injection hole 51.

The injection device may be designed so that the opening of the fluid channel 27 is effected by applying a voltage to the multi-layer piezoelectric element 1, and the closure of the fluid channel 27 is effected by stopping the voltage application.

Moreover, the injection device 19 in this embodiment may comprise the container 53 provided with the injection hole 51, and the above-mentioned multi-layer piezoelectric element 1, and the fluid stored in the container 53 may be injected through the injection hole 51 by driving the multi-layer piezoelectric element 1. That is, the multi-layer piezoelectric element 1 does not necessarily have to be placed inside the container 53, and it is thus sufficient that the injection device be designed so that the interior of the container 53 is subjected to a pressure for the control of fluid injection by the driving of the multi-layer piezoelectric element 1. In the injection device 19 in this embodiment, the term "fluid" refers to, in addition to fuel and ink, various matters in liquid form such as a conductive paste and various matters in gaseous form. The use of the injection device 19 in this embodiment makes it possible to control the flow rate of a fluid and the timing of fluid injection stably for a long period of time.

In the case of using the injection device 19 of this embodiment incorporating the above-mentioned multi-layer piezoelectric element 1 in an internal-combustion engine, as contrasted to the case of using a conventional injection device, it is possible to achieve injection of fuel into the combustion chamber of the internal-combustion engine such as an engine with high accuracy for a longer period of time.

Figure 8:
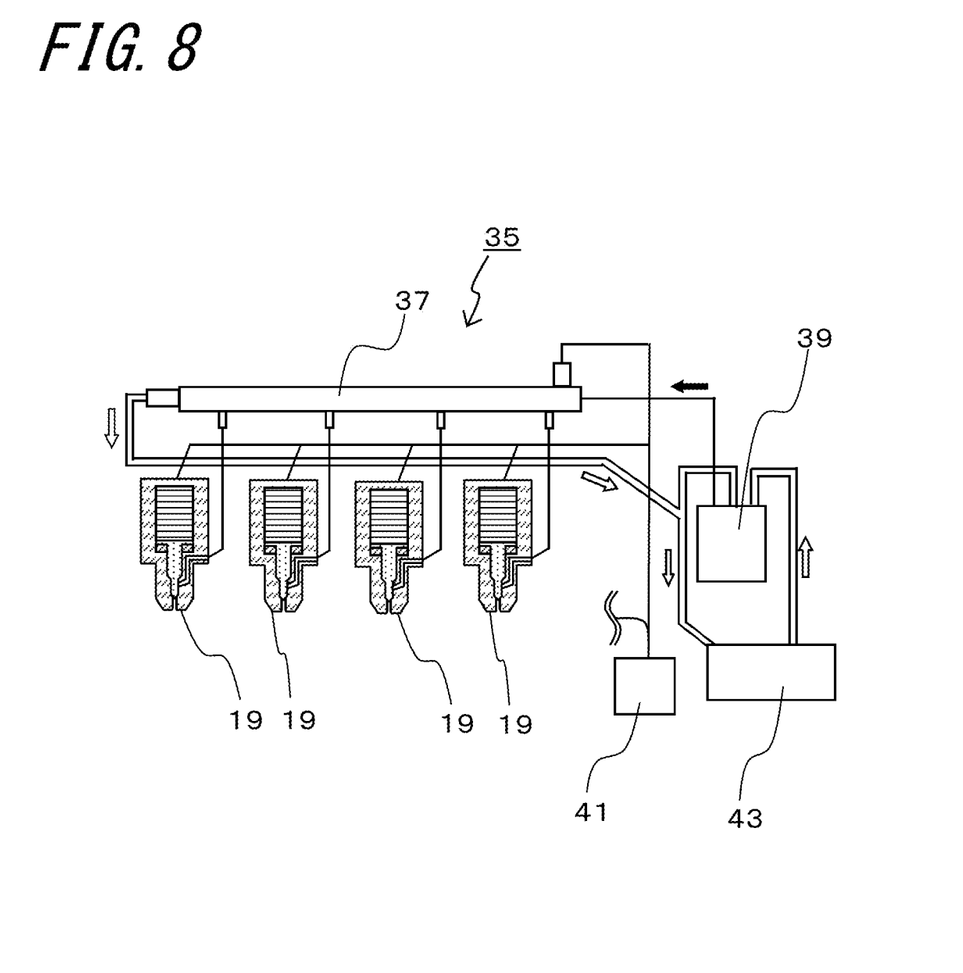
FIG. 8 is a schematic block diagram showing a fuel injection system in accordance with one embodiment of the invention.

The following describes an embodiment of a fuel injection system pursuant to the invention. FIG. 8 is a schematic diagram showing a fuel injection system in accordance with one embodiment of the invention.

As shown in FIG. 8, the fuel injection system 35 in this embodiment comprises: a common rail 37 configured to store a high-pressure fuel which is a high-pressure fluid; a plurality of the above-mentioned injection devices 19 configured to inject the high-pressure fluid stored in the common rail 37; a pressure pump 39 configured to supply the high-pressure fluid to the common rail 37; and an injection control unit 41 configured to send driving signals to the injection devices 19.

The injection control unit 41 controls the amount of injection of the high-pressure fluid and injection timing on the basis of external information or external signals. For example, when using the fuel injection system 35 in this embodiment for fuel injection in an engine, it is possible to control the amount of fuel injection and injection timing while detecting the conditions of the interior of the combustion chamber of the engine by a sensor or other means. The pressure pump 39 acts to supply the fluid fuel to the common rail 37 from a fuel tank 43 under high pressure. For example, in the fuel injection system 35 for use in engine application, the fluid fuel is fed to the common rail 37 under a pressure of as high as about 1000 to 2000 atmospheres (about 101 MPa to about 203 MPa), or preferably a pressure of as high as about 1500 to 1700 atmospheres (about 152 MPa to about 172 MPa). The common rail 37 stores therein the high-pressure fuel from the pressure pump 39, and supplies it to the injection device 19 on an as needed basis. As described above, the injection device 19 injects a certain amount of fluid to the outside or into an adjacent container through the injection hole 51. For example, when a target of fuel supply by injection is an engine, the injection device 19 injects the high-pressure fuel in fine-spray form into the combustion chamber of the engine through the injection hole 51.

The fuel injection system 35 in this embodiment is capable of effecting high-pressure fuel injection in a desired manner stably for a long period of time.

EXAMPLES

Examples of the invention will be described.

A multi-layer piezoelectric element was produced in the following manner. To begin with, a ceramic slurry was prepared by mixing calcined powder of piezoelectric ceramics composed predominantly of lead zirconate titanate ($PbZrO_3$—$PbTiO_3$) having an average particle size of 0.4 µm, a binder, and a plasticizer. Then, ceramic green sheets for forming 50 µm-thick piezoelectric layers were formed from the ceramic slurry by doctor blade technique.

Next, a conductive paste for forming the internal electrode layers was prepared by adding a binder to a silver-palladium alloy.

Next, the conductive paste for forming the internal electrode layer was printed to one side of the ceramic green sheet by the screen printing technique, and, 200 ceramic green sheets with the printed conductive paste were stacked on top of each other. With the stack of 200 ceramic green sheets having the printed conductive paste for forming the internal electrode layer set as a middle portion, a total of 15 ceramic green sheets free of printed conductive paste for forming the internal electrode layer were laminated on each of the top and the bottom of the middle portion. The layered body thus obtained was fired at a temperature of 980 to 1100° C., and then ground into a predetermined shape by a surface grinder. Thus, a stacked body which was 5 mm per side was obtained.

Next, to form a conductor layer which was 4.0 mm in width and 30 µm in thickness, a paste containing Ag powder and a glass component was applied to the surface of the stacked body by the screen printing technique, and then the paste was baked out at a temperature of 580 to 630° C.

Next, a conductive joining material in the form of a paste of a mixture of Ag powder and polyimide resin was applied to the surface of the stacked body by the dispensing technique, and an external electrode was fixedly connected to the surface of the stacked body.

As Sample 1, as shown in FIGS. 1A and 1B, there was produced a multi-layer piezoelectric element with use of a phosphor bronze-made external electrode which was 4.0 mm in width and 0.1 mm in thickness. To form a conductive joining material layer, a conductive adhesive made of a silver-polyimide material was applied between the side face of the active section and the external electrode. The conductive adhesive had a width of 3.5 mm and a thickness of 0.03 mm. Moreover, the end part of the external electrode remained free of the applied conductive adhesive, and the end part was subjected to soldering of solder made of tin, silver, and copper using a soldering iron to permit the joining together of the external electrode and the conductor layer. The solder was placed within the range of the inactive section, and, the solder was 2.0 mm in length in the stacking direction and 4.0 mm in width.

Moreover, there was produced Sample 2 in which, as shown in FIG. 2, the boundary between the conductive adhesive and the solder coincided with the boundary between the active section and the inactive section of the stacked body.

Moreover, there was produced Sample 3 in which, as shown in FIGS. 4A and 4B, a void was present in the boundary between the conductive adhesive and the solder. This was achieved by applying a conductive adhesive bearing air bubbles to the boundary between the active section and the inactive section by a dispenser. In the void-bearing boundary as seen in a section, the void ranged in diameter from 3 µm to 10 µm, and, based on the section along the boundary, the area of the void constituted about 40 to 60%.

Moreover, there was produced Sample 4 in which, as shown in FIGS. 6A and 6B, a lead was joined to the solder portion at the end part of the external electrode.

In addition, there was produced a multi-layer piezoelectric element as shown in FIGS. 9A and 9B as a comparative example (Sample 5). In this construction, an external electrode which was 0.1 mm in thickness and 4.0 mm in width was used, and, a conductive adhesive was applied in thickness of 0.2 mm and in width of 4 mm.

In these multi-layer piezoelectric elements, a DC electric field of 3 kV/mm was applied to the external electrode for 15 minutes to effect polarization. In each multi-layer piezoelectric element under application of DC voltage of 160 V, a displacement of 30 μm was found in the stacked body in the stacking direction.

Moreover, as durability tests, the multi-layer piezoelectric elements were driven continuously under application of AC voltage in the range of 0 V to +160 V at a frequency of 150 Hz, at a temperature of 30° C., and at a humidity of 90%.

As a result, in the multi-layer piezoelectric element of Sample 5 produced as the comparative example, the end of the external electrode separated at the $1\times10^4$-th trial of continuous driving, and the operation of this multi-layer piezoelectric element was caused to stop at the $1\times10^5$-th trial.

On the other hand, the multi-layer piezoelectric elements of Sample 1, Sample 2, Sample 3, and Sample 4 produced as the example of the invention continued to operate without occurrence of separation of the external electrode even after the $1\times10^7$-th trial of continuous driving.

As will be understood from the test results thus far described, the invention succeeded in providing a multi-layer piezoelectric element having excellent long-term durability.

REFERENCE SIGNS LIST

1: Multi-layer piezoelectric element
10: Stacked body
11: Piezoelectric layer
12: Internal electrode layer
13: Active section
14: Inactive section
15: Conductor layer
2: Conductive joining material layer
21: Solder
22: Conductive adhesive
23: Void
3: External electrode
4: Lead

The invention claimed is:

1. A multi-layer piezoelectric element, comprising:
a stacked body in which piezoelectric layers and internal electrode layers are laminated;
a conductor layer disposed on a side face of the stacked body;
a conductive joining material layer disposed on a surface of the conductor layer; and
an external electrode joined to the conductor layer via the conductive joining material layer,
the conductive joining material layer comprising solder and a conductive adhesive, the solder constituting an end of the conductive joining material layer which confronts an end of the external electrode to be connected to an external circuit,
wherein the conductive adhesive constitutes a remaining part of the conductive joining material layer except the end of the conductive joining material layer, and
a void is provided in the boundary between the solder and the conductive adhesive constituting the conductive joining material layer.

2. The multi-layer piezoelectric element according to claim 1,
wherein the stacked body comprises an active section and an inactive section,
the solder and the conductive adhesive constitute the conductive joining material layer, and
a boundary between the solder and the conductive adhesive is located at a position corresponding to a boundary between the active section and the inactive section.

3. The multi-layer piezoelectric element according to claim 2,
wherein, when the multi-layer piezoelectric element is viewed in a section taken along a stacking direction thereof, the conductive adhesive extends, at a side facing the conductor layer thereof, from the active section to the inactive section so as to impart an inclination or curve to the boundary between the conductive adhesive and the solder.

4. The multi-layer piezoelectric element according to claim 1,
wherein the stacked body comprises an active section and an inactive section,
the solder and the conductive adhesive constitute the conductive joining material layer, and
a boundary between the solder and the conductive adhesive is located on a side of the active section beyond a boundary between the active section and the inactive section.

5. The multi-layer piezoelectric element according to claim 1,
wherein a lead is soldered to an end of the external electrode to be connected to an external circuit which end confronts an end of the conductive joining material layer made of solder.

6. An injection device, comprising:
a container provided with an injection hole; and
a multi-layer piezoelectric element comprising
a stacked body in which piezoelectric layers and internal electrode layers are laminated;
a conductor layer disposed on a side face of the stacked body;
a conductive joining material layer disposed on a surface of the conductor layer; and
an external electrode joined to the conductor layer via the conductive joining material layer,
the conductive joining material layer comprising solder and a conductive adhesive, the solder constituting an end of the conductive joining material layer which confronts an end of the external electrode to be connected to an external circuit,
wherein the conductive adhesive constitutes a remaining part of the conductive joining material layer except the end of the conductive joining material layer, and
a void is provided in the boundary between the solder and the conductive adhesive constituting the conductive joining material layer,
a fluid stored in the container being injected through the injection hole by driving the multi-layer piezoelectric element.

7. A fuel injection system, comprising:
a common rail configure to store a high-pressure fuel;
an injection device configured to inject the high-pressure fuel stored in the common rail, the injection device comprising
a container provided with an injection hole; and
a multi-layer piezoelectric element comprising
a stacked body in which piezoelectric layers and internal electrode layers are laminated;

a conductor layer disposed on a side face of the stacked body;
a conductive joining material layer disposed on a surface of the conductor layer; and
an external electrode joined to the conductor layer via the conductive joining material layer,
the conductive joining material layer comprising solder and a conductive adhesive, the solder constituting an end of the conductive joining material layer which confronts an end of the external electrode to be connected to an external circuit,
wherein the conductive adhesive constitutes a remaining part of the conductive joining material layer except the end of the conductive joining material layer, and
a void is provided in the boundary between the solder and the conductive adhesive constituting the conductive joining material layer;

a fluid stored in the container being injected through the injection hole by driving the multi-layer piezoelectric element;

a pressure pump configured to supply the high-pressure fuel to the common rail; and an injection control unit configured to send a driving signal to the injection device.

* * * * *